(12) United States Patent  
Wrigley et al.

(10) Patent No.: US 8,624,769 B2
(45) Date of Patent: Jan. 7, 2014

(54) MIXED LINEAR/SQUARE-ROOT ENCODED SINGLE SLOPE RAMP PROVIDES A FAST, LOW NOISE ANALOG TO DIGITAL CONVERTER WITH VERY HIGH LINEARITY FOR FOCAL PLANE ARRAYS

(75) Inventors: Christopher James Wrigley, La Crescenta, CA (US); Bruce R. Hancock, Altadena, CA (US); Kenneth W. Newton, Castaic, CA (US); Thomas J. Cunningham, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/572,098

(22) Filed: Aug. 10, 2012

(65) Prior Publication Data

US 2013/0038482 A1 Feb. 14, 2013

Related U.S. Application Data

(60) Provisional application No. 61/522,458, filed on Aug. 11, 2011.

(51) Int. Cl.
*H03M 1/12* (2006.01)

(52) U.S. Cl.
USPC .......................................... 341/155; 341/169

(58) Field of Classification Search
USPC .......................................... 341/137, 155, 169
See application file for complete search history.

(56) References Cited

U.S. PATENT DOCUMENTS

| 5,909,256 | A | * | 6/1999 | Brown | 348/723 |
|---|---|---|---|---|---|
| 6,867,804 | B1 | * | 3/2005 | Kim et al. | 348/294 |
| 7,075,474 | B2 | * | 7/2006 | Yamagata et al. | 341/169 |
| 7,265,329 | B2 | * | 9/2007 | Henderson et al. | 250/208.1 |
| 7,274,319 | B2 | * | 9/2007 | Lee | 341/155 |
| 7,304,599 | B2 | * | 12/2007 | Lee | 341/169 |
| 7,479,916 | B1 | | 1/2009 | Reshef et al. | |
| 7,656,336 | B2 | | 2/2010 | Wood | |
| RE41,767 | E | * | 9/2010 | Lee | 341/155 |
| 7,907,079 | B1 | | 3/2011 | Galloway et al. | |
| 2005/0057389 | A1 | * | 3/2005 | Krymski | 341/169 |
| 2006/0028368 | A1 | * | 2/2006 | Takayanagi et al. | 341/155 |
| 2009/0033532 | A1 | * | 2/2009 | Reshef et al. | 341/137 |
| 2011/0001039 | A1 | * | 1/2011 | Hoshino | 250/208.1 |
| 2012/0126094 | A1 | * | 5/2012 | Simony et al. | 250/208.1 |

OTHER PUBLICATIONS

PCT International Search Report & Written Opinion dated Jan. 31, 2013 for PCT Application No. PCT/US2012/050338.
Storm, G. G., et al., "Combined Linear-Logarithmic CMOS Image Sensor", In: 2004 IEEE International Solid-State Circuits Conference (ISSCC) 2004, vol. 1, Digest of Technical Papers, Feb. 2004.
Diner, D.J. et al., "First results from a dual photoelastic modulator-based polarimetric camera," 2010, Appl. Opt. 49, 2929-2946.

* cited by examiner

*Primary Examiner* — Jean B Jeanglaude
(74) *Attorney, Agent, or Firm* — Gates & Cooper LLP (57) ABSTRACT

An analog-to-digital converter (ADC) converts pixel voltages from a CMOS image into a digital output. A voltage ramp generator generates a voltage ramp that has a linear first portion and a non-linear second portion. A digital output generator generates a digital output based on the voltage ramp, the pixel voltages, and comparator output from an array of comparators that compare the voltage ramp to the pixel voltages. A return lookup table linearizes the digital output values.

18 Claims, 7 Drawing Sheets

MIXED LINEAR/SQUARE-ROOT ENCODED SINGLE SLOPE RAMP PROVIDES A FAST, LOW NOISE ANALOG TO DIGITAL CONVERTER WITH VERY HIGH LINEARITY FOR FOCAL PLANE ARRAYS

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Ser. No. 61/522,458, filed on Aug. 11, 2011, by Chris J. Wrigley, Bruce R. Hancock, Kenneth W. Newton, and Thomas J. Cunningham, entitled "Mixed Linear/Square-Root Encoded Single Slope Ramp Provides a Fast, Low Noise ADC with Very High Linearity for Focal Plane Arrays."

STATEMENT REGARDING FEDERALLY SPONSORED RESEARCH AND DEVELOPMENT

The invention described herein was made in the performance of work under a NASA Contract, and is subject to the provisions of Public Law 96-517 (35 USC 202) in which the Contractor has elected to retain title.

BACKGROUND OF THE INVENTION

1. Field of the Invention

The present invention relates generally to analog-to-digital (ADC) converters, and in particular, to a method, apparatus, and article of manufacture for an ADC with a voltage ramp that has both a linear and non-linear portion. Furthermore, this ADC can be precisely calibrated to provide a linear output.

2. Description of the Related Art (Note: This application references a number of different publications as indicated throughout the specification by reference numbers enclosed in brackets, e.g., [x]. A list of these different publications ordered according to these reference numbers can be found below in the section entitled "References." Each of these publications is incorporated by reference herein.)

Single-slope column-parallel Analog-to-Digital Converters (ADCs) are very popular for CMOS (complementary metal-oxide-semiconductor) imagers. However such ADCs have limited resolution for a given speed, or equivalently, low speed for a given resolution. For example, 256 clock cycles are required to achieve 8 bit resolution. Accordingly, what is needed is an ADC that provides high resolution and high speed.

SUMMARY OF THE INVENTION

One or more embodiments of the invention provide a single-slope ADC for a CMOS imager where the voltage ramp has a first portion that is linear and a second portion that is non-linear.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof. These drawings show, by way of illustration, several embodiments of the present invention. It is understood that other embodiments may be utilized and structural changes may be made without departing from the scope of the present invention.

Figure 1:
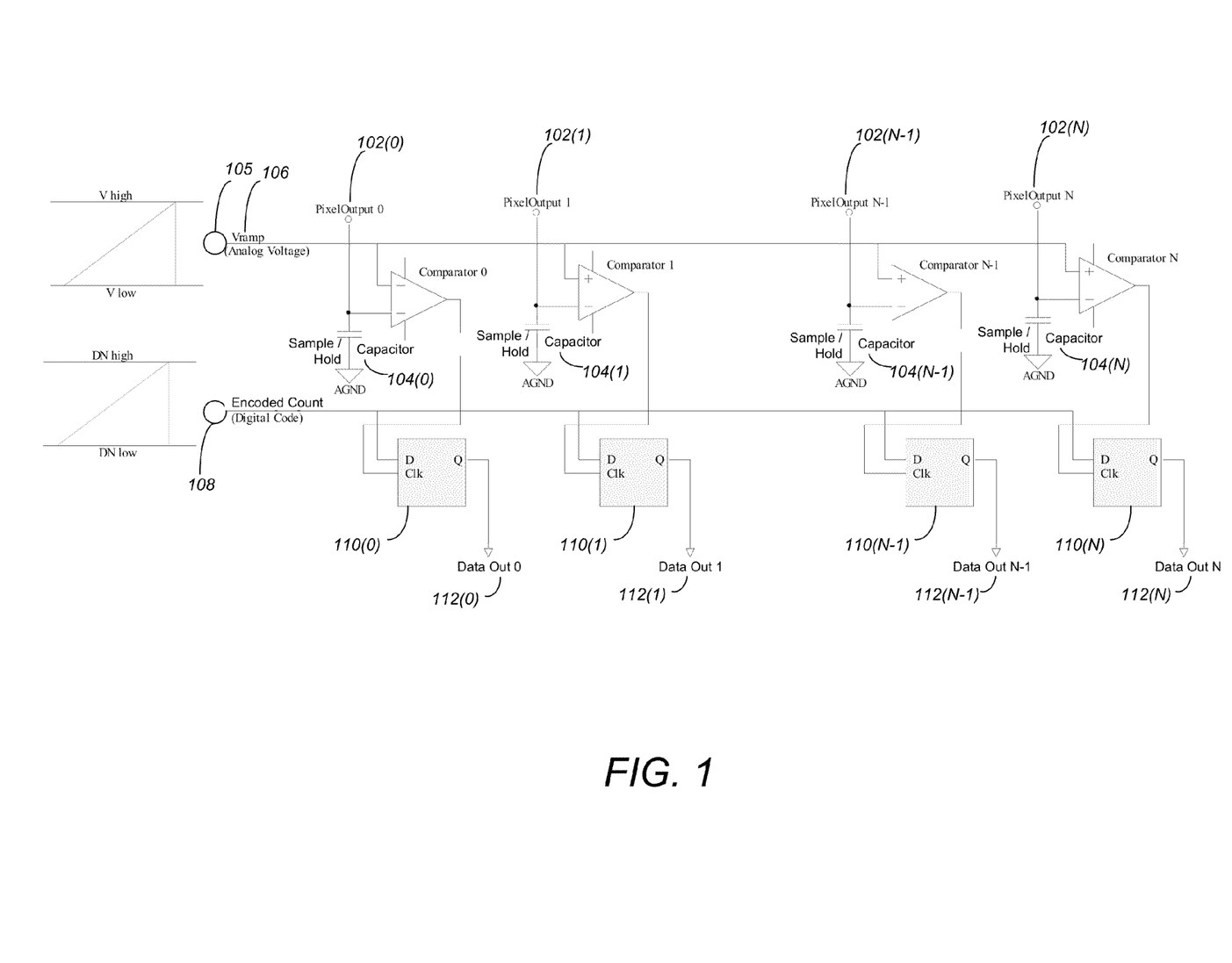
FIG. 1 illustrates a column-parallel single-slope ADC architecture used in accordance with one or more embodiments of the invention.

FIG. 1 shows a typical CMOS single slope column-parallel ADC converter array. The pixel voltages 102 (i.e., 102(0)-102(N)) are sampled onto the sample capacitor 104 (i.e., 104(0)-104(N)), then the voltage ramp 106 (generated by a voltage ramp generator 105) is started. At the same time, a digital counter 108 is started. When the comparator (i.e., comparator O-comparator N) trips, it triggers the clock input of the corresponding latch 110 such that the counter 108 value (Encoded Count/Digital Code) (as input "D") is captured by the latch 110 (i.e., latches 110(0)-110(N)), to be read out 112 (as Data Out [0-N]) later.

To mitigate the speed-resolution limitation, the signal level dependence of photon shot noise may be exploited. The number of photons arriving in a given time interval is not fixed, but is subject to statistical fluctuations. These fluctuations produce a temporal noise known as shot noise. The shot noise follows a Poisson distribution, where the variance of the number of arriving photons is equal to the mean number. For large signals, where the shot noise is large, the resolution is limited by the shot noise and fine quantization steps provide no benefit. On the other hand, when the signal is small the shot noise is also small and fine quantization steps are beneficial. The preferred approach is to vary the size of the quantization steps in accordance with the signal level, such that the quantization noise is always less than the shot noise. For a given number of steps, this allows more steps to be allocated to lower signal levels where they are more valuable, and uses fewer steps for high signal levels, where they are not needed.

The pixel collects photoelectrons, converts the resulting signal charge to a voltage by way of the pixel capacitance and buffers this voltage through the pixel amplifier. The transfer function of this conversion is commonly approximated as a linear relationship. An ADC may then convert this pixel voltage to a digital code value. The combined transfer function of the pixel ADC can be written as $$Q = Q(N) \quad (1)$$

where Q is the signal charge, in electrons, and N is the digital code value. The quantization noise (QN) variance ($\sigma^2$), expressed in electrons, is $$\sigma_{Q,QN}^2 = \left(\frac{dQ}{dN}\right)^2 \sigma_N^2 = \frac{1}{12}\left(\frac{dQ}{dN}\right)^2 \quad (2)$$

using the well known variance for a uniform distribution from 0 to 1, $\sigma_N^2 = 1/12$.

Meanwhile, as described above, the variance ($\sigma^2$) due to the shot noise (SN) is:

$$\sigma_{Q,SN}^2 = Q \quad (3)$$

If one implements a transfer function:

$$Q = 3\alpha N^2 \quad (4)$$

substitution in (2) and (3) will show that the quantization noise is everywhere proportional to the shot noise (SN), $\sigma_{Q,QN}^2 = \alpha \sigma_{Q,SN}^2$. If a $\alpha \gg 1$, the total noise will be dominated by the shot noise. The significance of this may be illustrated by noting that signals from 0 to 50,000 electrons can be quantized using only 256 code values with $\alpha = \frac{1}{4}$, such that the contribution of the quantization noise degrades the signal-to-noise ratio by only 1 dB. This is commonly known as square root encoding, since the code value varies as the square root of the signal charge, but the encoding is usually performed after digitization.

Square root encoding of the voltage can be easily implemented in the column-parallel single slope architecture by supplying a quadratic ramp, $V \propto N^2$, instead of a linear one. As in a conventional single-slope ADC with a linear ramp, a code value will be captured when the ramp voltage is equal to the signal level. Knowing the form of the ramp, V(N), the pixel voltage can be determined. If the transfer function of the pixel from charge to voltage is linear (or approximately so), square root encoding of the voltage is equivalent to square root encoding of the charge.

The problem with simple square root encoding is that the conversion by the pixel of charge into voltage generally includes an offset, $V = \gamma Q + V_0$, where $\gamma$ is the conversion gain and $V_0$ is the offset. Thus, the voltage ramp should be $V = 3\alpha\gamma N^2 + V_0$. With the very small step size near Q=0, it is essential that the appropriate value of $V_0$ be accurately known. However, imagers inevitably have fixed pattern noise (FPN) resulting in different offsets, $V_0$, from one pixel to the next. In order that all pixels can be quantized using the same ramp, it will be necessary to adjust the starting voltage of the ramp to the lowest offset value. Although this will allow all pixel voltages to be quantized, for pixels with higher offsets the signal levels will be captured farther up the ramp where the quantization noise is larger. Thus the advantage of small quantization steps may be lost.

Figure 2:
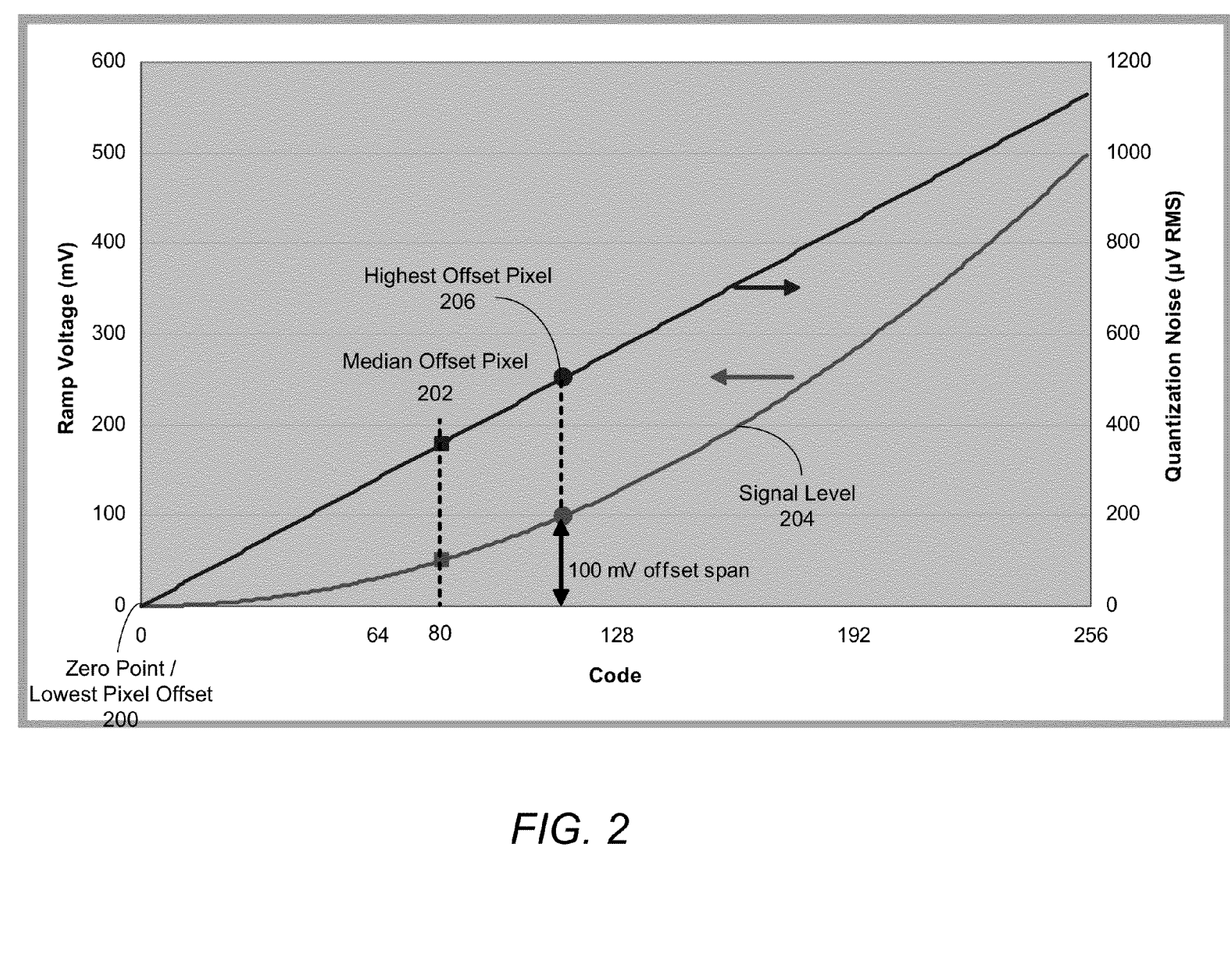
FIG. 2 illustrates a square-law ramp, showing transfer curve and quantization noise in accordance with one or more embodiments of the invention.

As an example, consider a 512 step ramp spanning 2V, with a FPN spanning 100 mV peak-to-peak. FIG. 2 illustrates the beginning portion of a square-law ramp, showing the transfer curve and quantization noise. In order to quantize all the pixels, the starting value of the ramp must be shifted to the lowest offset value 200. This will be digitized with a quantization noise as low as 5 µV. In the dark, a pixel with the median offset 202 of 50 mV would be quantized at code 80, where the quantization noise is 360 µV, even though, with Q=0, this pixel would exhibit no shot noise. The pixel with the highest offset 206 would have a quantization noise of 500 µV in the dark. Thus, the zero-point shift needed to keep all pixels on scale may cause quantization noise in excess of shot noise for most other pixels at low signal level.

To solve this problem, embodiments of the invention break the ramp into two parts: an initial linear segment, covering the FPN, followed by a non-linear segment (e.g., a quadratic segment). Such a ramp may have the form:

$$V = a_1 N; N < N_0$$

$$V = a_1 N + a_2 (N - N_0)^2; N \geq N_0 \quad (5)$$

where $a_1$, $a_2$ and $N_0$ are constants chosen to meet the requirements for FPN and full well.

Such a form ensures that the two segments match and have the same slope at their transition. The ramp can be optimized by first choosing $a_2$ so that $\alpha \approx 0.25$. Then $N_0$ is chosen to provide the required ramp span with $a_1 = FPN/N_0$. Note that attempting to set $a_2$ too low, e.g. so that $\alpha < 0.1$, is counterproductive since the improvement in SNR diminishes rapidly, while fewer code values will be available for the linear portion, increasing the minimum quantization noise.

Such a solution has been applied in a Multi-angle Spectropolarimetric Imager (MSPI) [1]. This 1536×64 imager has a conversion gain of 20 µV/e$^-$, a full well of >50,000e- and provides a CDS (correlated double sample) noise floor of 13e$^-$ at 7000 rows/sec or 10.8 Mpix/sec.

Figure 3:
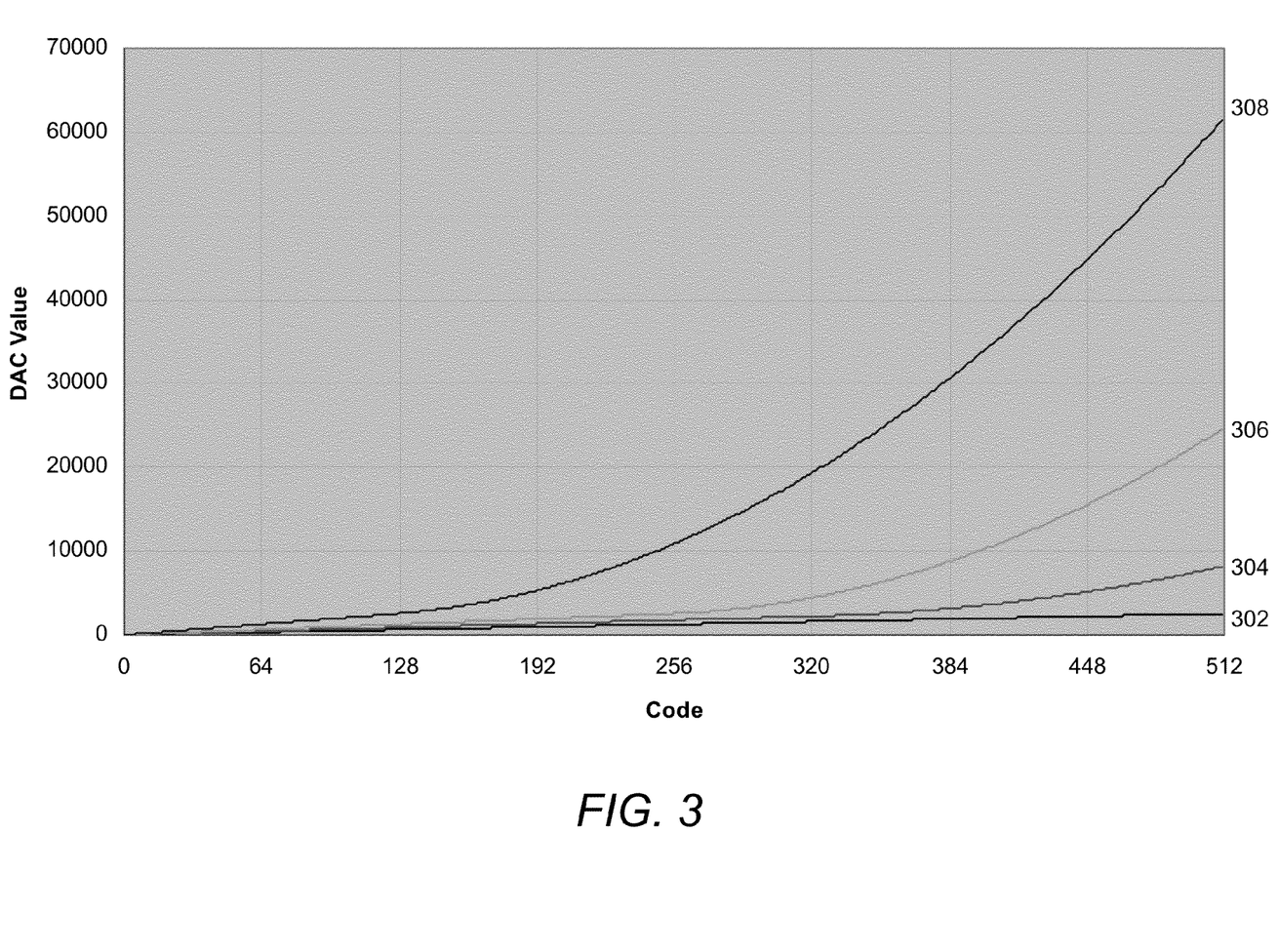
FIG. 3 illustrates four different combination linear-quadratic ramps, used for different signal levels in accordance with one or more embodiments of the invention.

The MSPI embodiment of the invention generates the ramp using a lookup table and a precision 16-bit digital-to-analog converter (DAC), although other digital or even analog methods of generating the ramp are possible. In the MSPI embodiment it was convenient to implement four different ramps with different spans for different signal levels, i.e. different gain settings. Accordingly, FIG. 3 illustrates four different combination linear-quadratic ramps (302-308), used for different signal levels in accordance with one or more embodiments of the invention.

Figure 4:
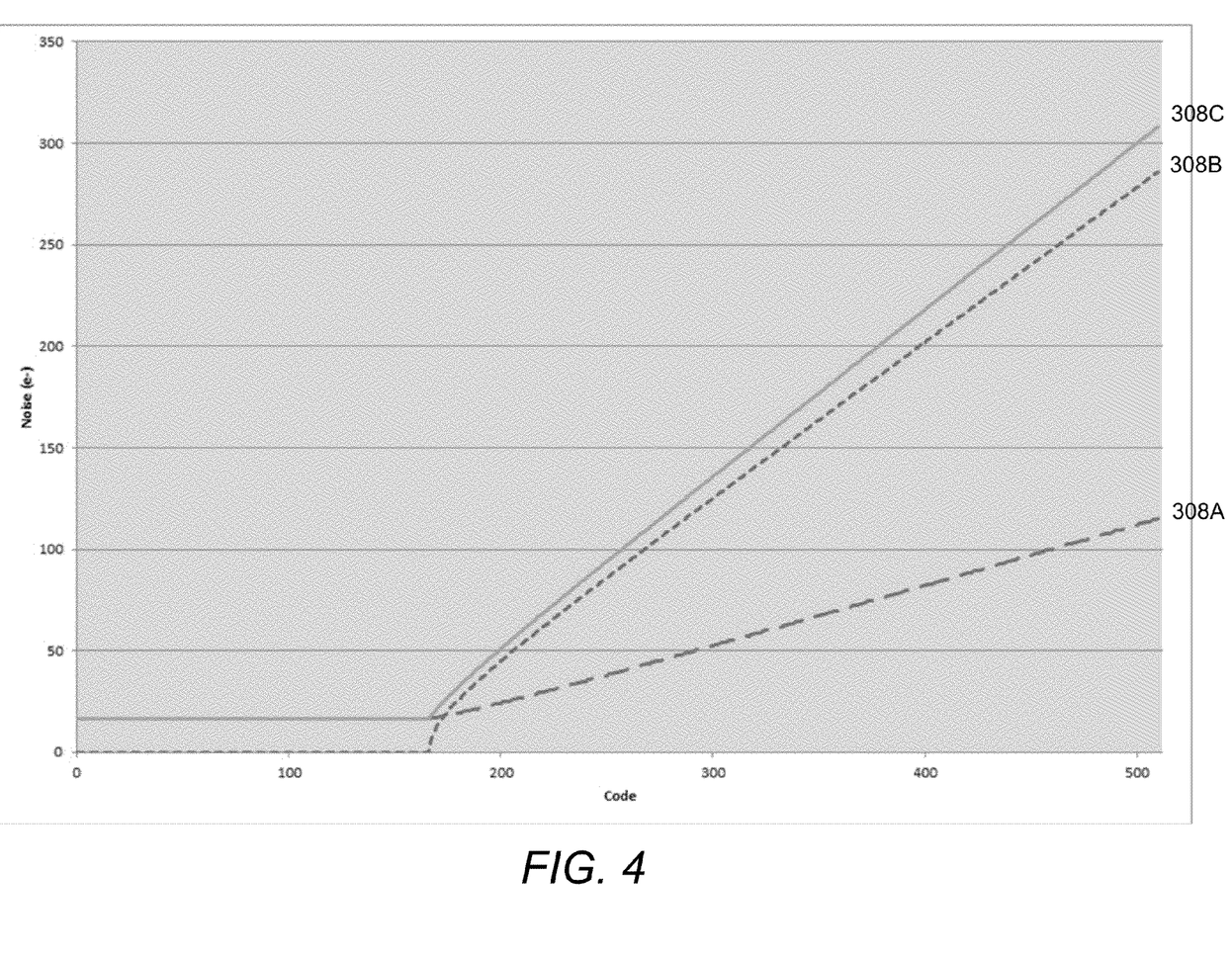
FIG. 4 shows the quantization noise, shot noise and combined noise for the largest ramp of FIG. 3 in accordance with one or more embodiments of the invention.

FIG. 4 shows the quantization plus amplifier noise, shot noise and combined noise for the largest (i.e., ramp 308) of these four ramps. The quantization plus amplifier noise is shown with dashes (308A); the shot noise for the worst case offset pixel with dots (308B); and the combined noise with a solid line (308C). Amplifier noise is included in the quantization noise for completeness. The combined noise (308C) is only slightly higher than the shot noise limit.

Referring again to FIG. 1, when the comparator determines that the ramp 106 value is equal to the signal value 102, the current code value 108 is captured into a latch 110. This code value 108 then needs to be re-interpreted as a voltage. In the simplest approach, the code value 108 can be used as an index into a table that was used to generate the ramp 106. However, although such an indexed value represents the voltage that the DAC was commanded to generate at the time that code value 108 was present, the effective voltage may be somewhat different, notably due to the finite bandwidths of a ramp buffer amplifier and the comparator. Limiting these bandwidths is, in fact, desirable since it reduces the noise bandwidth and hence the read noise.

To first order, the effect of these limited bandwidths can be viewed as a delay of the ramp 106. For a linear ramp, this is equivalent to a voltage offset, but for a nonlinear ramp the circumstances are more complicated. The effect shows up most prominently when looking at the differential gain, and especially at the transition between the linear and quadratic portions. Although the code value 108 may indicate that the ramp 106 is in the quadratic region, effectively it may still be in the linear region, with the result that the signal is overestimated.

Figure 5:
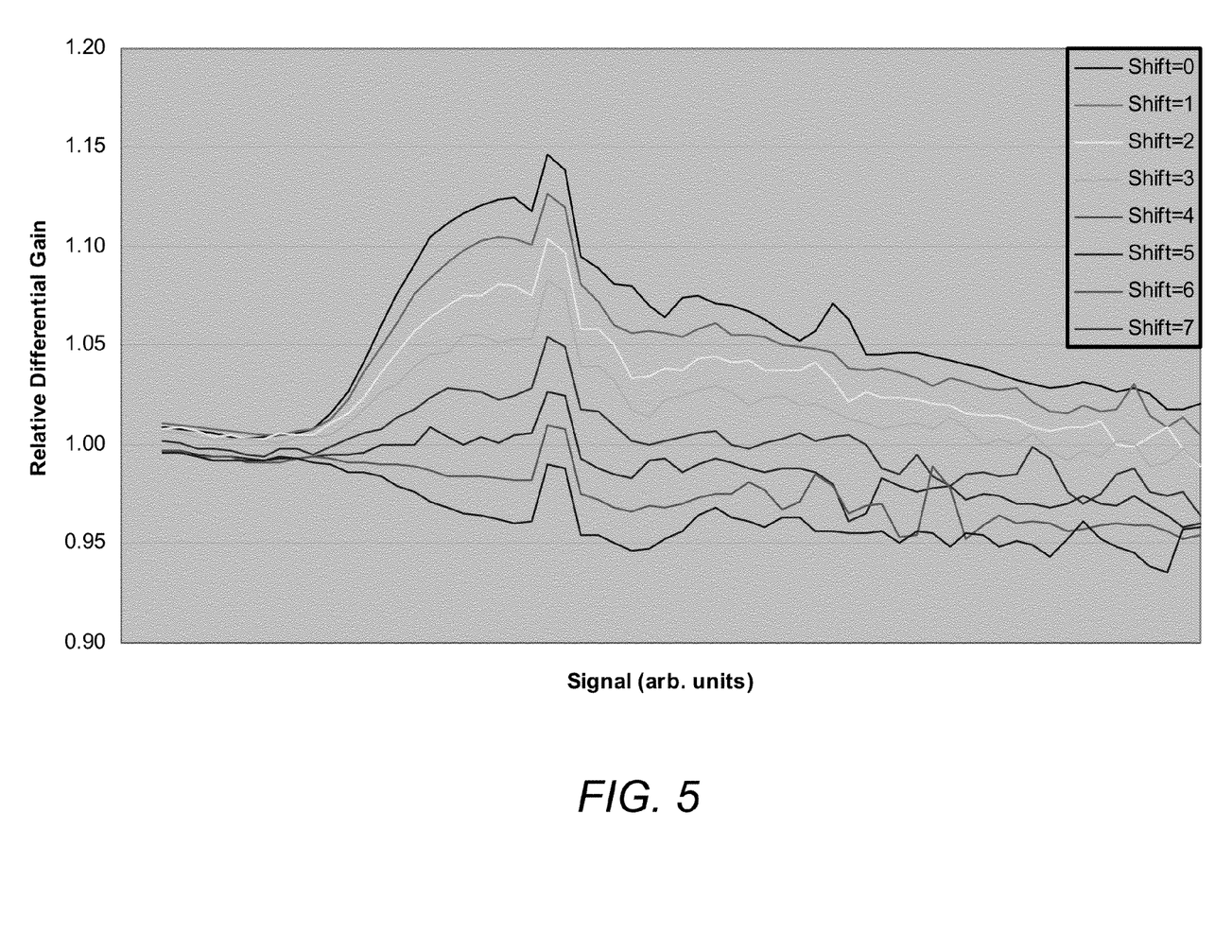
FIG. 5 illustrates the improvement of differential linearity using a shifted version of the ramp lookup table for the return lookup in accordance with one or more embodiments of the invention.

To the extent that the difference between the commanded and effective ramp voltages can be modeled as a simple delay, a correction may be implemented by applying a backward shift when indexing the code 108 into the ramp table. Such a backward shift was attempted for the MSPI imager. In this regard, FIG. 5 illustrates the improvement of the differential gain (from charge to digital value) using a shifted version of the ramp lookup table for the return lookup. With no shift (i.e., shift=0), there is a large hump in the differential gain. In FIG. 5, the overall slope results from the photodiode capacitance-voltage relationship, while the persistent narrow feature near the center is a result of differential nonlinearity (DNL) in the lower quality DAC that generated the ramp 106 in this experiment.

Figure 6:
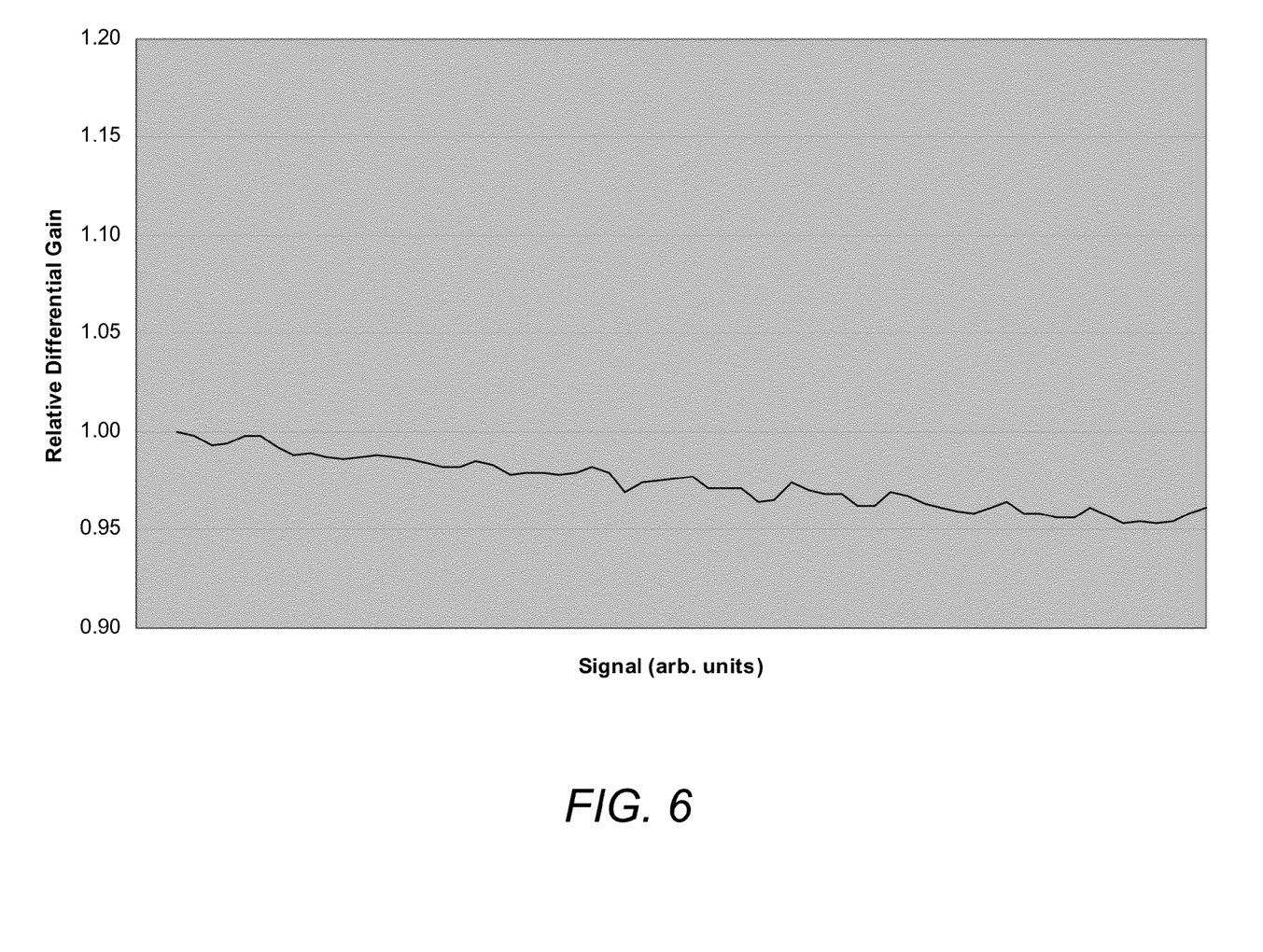
FIG. 6 shows the differential linearity with a calibrated lookup table implemented in accordance with one or more embodiments of the invention.

A better solution is found by creating a separate, calibrated return lookup table. In embodiments of the invention, an analog calibration voltage generated by a precision DAC may be directly injected onto the Sample hold caps (104). Alternatively, a calibration signal could be generated using the pixels and a carefully controlled photo signal. Each entry in the return lookup table is assigned the value of the input signal that produces its associated code value, optionally with appropriate offset and scaling. Due to noise, and because the calibration signal typically has higher resolution than the ADC being calibrated, a given output code value may be produced by multiple, different input values. In this case, the use of weighted averages can be used to produce very precise calibration. FIG. 6 shows the differential gain for the same MSPI device with a calibrated lookup table implemented in accordance with one or more embodiments of the invention. The hump and the feature due to DAC DNL are removed; the remaining fluctuations are due to shot noise that has been insufficiently averaged.

In summary, a combination linear and quadratic ramp allows a single slope ADC to provide shot noise limited performance with a manageable number of code values, even in the presence of fixed pattern noise. In addition, a separate return lookup table may be used to correct for the delaying effect of finite bandwidth, producing excellent differential linearity. Finally, it should be noted that, for CDS, both samples must be linearized before subtraction.

Logical Flow

Figure 7:
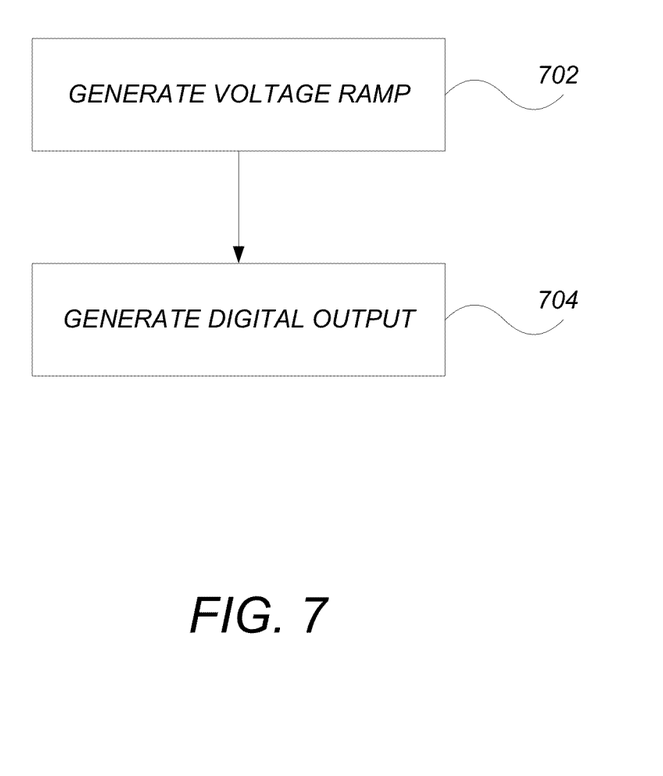
FIG. 7 illustrates the logical flow for converting an analog signal to a digital signal in accordance with one or more embodiments of the invention.

FIG. 7 illustrates the logical flow for converting an analog signal to a digital signal in accordance with one or more embodiments of the invention (e.g., via a CMOS single slope column parallel ADC array).

At step 702, a voltage ramp is generated (by a voltage ramp generator) that has a linear first portion and a non-linear second portion. The non-linear second portion may be a quadratic portion. Further the voltage ramp (V) may have the form:

$$V = a_1 N; N < N_0$$

$$V = a_1 N + a_2 (N - N_0)^2; N \geq N_0$$

where N is the digital code value and the parameters $a_1$, $a_2$ and $N_0$ are chosen appropriately to the FPN and required full well (e.g., suitable to a signal range). This form ensures that the first portion and the second portion match, and the first portion and second portion have the same slope at their transition. The first portion of the voltage ramp may be configured to cover a fixed pattern noise (FPN) while the second portion may be optimized such that a quantization noise is less than a shot noise.

To generate the voltage ramp, a look-up table may be used to drive a precision DAC.

At step 704, a digital output is generated (e.g., by a digital output generator that includes one or more of the various components illustrated in FIG. 1 [e.g., the digital counter 108, latch 110, etc.]). The digital output is based on the voltage ramp, a plurality of pixel voltages for a plurality of pixels (e.g., from a CMOS image), and comparator output from an array of comparators that are configured to compare the voltage ramp to the plurality of pixel voltages.

To generate the digital output, each of the plurality of pixel voltages may be sampled onto a corresponding sample capacitor. Thereafter, the voltage ramp and a digital counter may be simultaneously started. A latch is used to capture a value of the digital counter when each of the comparators trips (for subsequent digital readout). Such comparators may have the voltage ramp as the first input and one of the pixel voltages as a second input.

The captured digital values may be translated/converted to a linearized voltage or charge values by means of a return lookup table.

The return lookup table may be implemented as the ramp generation lookup table with a backward shift added or may be obtained by calibration against a precision source/input (with an average value of the input signal used to produce a return look-up table entry for a given code value).

CONCLUSION

This concludes the description of the preferred embodiment of the invention. The following describes some alternative embodiments for accomplishing the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

[1] Diner, D. J., A. Davis, B. Hancock, S. Geier, B. Rheingans, B. Jovanovic, M. Bull, D. M. Rider, R. A. Chipman, R A. Mahler, and S. McClain (2010). First results from a dual photoelastic modulator-based polarimetric camera. *Appl Opt.* 49, 2929-2946.

What is claimed is:

1. An analog-to-digital converter (ADC) comprising:
  (a) a voltage ramp generator configured to generate a voltage ramp having a linear first portion and a non-linear second portion; and
  (b) a digital output generator configured to generate a digital output based on:
    (1) the voltage ramp;
    (2) a plurality of pixel voltages for a plurality of pixels;
    (3) comparator output from an array of comparators that are configured to compare the voltage ramp to the plurality of pixel voltages.

2. The ADC of claim 1, wherein the second portion of the voltage ramp comprises a quadratic portion.

3. The ADC of claim 2, wherein:
  the voltage ramp (V) has the form:

$$V = a_1 N; N < N_0$$

$$V = a_1 N + a_2 (N - N_0)^2; N \geq N_0$$

N is a digital code value;

$a_1$, $a_2$ and $N_0$ are selected parameters suitable to a signal range;

the first portion and the second portion match at their transition; and the first portion and the second portion have the same slope at their transition.

4. The ADC of claim 1, wherein:

the first portion of the voltage ramp covers a fixed pattern noise (FPN); and the second portion of the voltage ramp is optimized wherein a quantization noise is less than a shot noise.

5. The ADC of claim 1, wherein the ADC comprises a complimentary metal-oxide-semiconductor (CMOS) single slope column parallel ADC converter array.

6. The ADC of claim 1, wherein:

each of the plurality of pixel voltages is sampled onto a corresponding sample capacitor;

the voltage ramp is started simultaneously with a digital counter;

each of the comparators in the array has a first input comprising the voltage ramp and a second input comprising one of the pixel voltages; and when the comparator trips, a counter value of the digital counter is captured by a latch for subsequent digital readout.

7. The ADC of claim 1, wherein:

the captured counter value is converted to a linearized voltage value according to a return look-up table.

8. The ADC of claim 7, wherein:

the return look-up table is implemented as a ramp generation look-up table with a backward shift.

9. The ADC of claim 7, wherein:

the return look-up table is obtained by calibration against a precision input; and an average value of an input signal is used to produce a return look-up table entry for a given code value.

10. A method for converting an analog signal to a digital signal comprising:

(a) generating a voltage ramp having a linear first portion and a non-linear second portion; and (b) generating a digital output based on:

(1) the voltage ramp;

(2) a plurality of pixel voltages for a plurality of pixels;

(3) comparator output from an array of comparators that are configured to compare the voltage ramp to the plurality of pixel voltages.

11. The method of claim 10, wherein the second portion of the voltage ramp comprises a quadratic portion.

12. The method of claim 11, wherein:

the voltage ramp (V) has the form:

$$V = a_1 N; N < N_0$$

$$V = a_1 N + a_2 (N - N_0)^2; N \geq N_0$$

N is a digital code value;

$a_1$, $a_2$ and $N_0$ are selected parameters suitable to a signal range;

the first portion and the second portion match at their transition; and the first portion and the second portion have the same slope at their transition.

13. The method of claim 10, wherein:

the first portion of the voltage ramp covers a fixed pattern noise (FPN); and the second portion of the voltage ramp is optimized wherein a quantization noise is less than a shot noise.

14. The method of claim 10, wherein the method is performed by a complimentary metal-oxide-semiconductor (CMOS) single slope column parallel analog-to-digital converter array.

15. The method of claim 10, further comprising:

sampling each of the plurality of pixel voltages onto a corresponding sample capacitor;

simultaneously starting the voltage ramp and a digital counter;

capturing, by a latch for subsequent digital readout, a counter value of the digital counter when each of the comparators trips, wherein each of the comparators in the array has a first input comprising the voltage ramp and a second input comprising one of the pixel voltages.

16. The method of claim 10, further comprising:

converting the captured counter value to a linearized voltage value according to a return look-up table.

17. The method of claim 16, further comprising:

implementing the return look-up table as a ramp generation look-up table with a backward shift.

18. The method of claim 16, further comprising:

obtaining the return look-up table by calibration against precision input; and producing a return look-up table entry for a given code value based on an average value of an input signal.

\* \* \* \* \*